(12) United States Patent
Duggan

(10) Patent No.: US 7,765,453 B2
(45) Date of Patent: Jul. 27, 2010

(54) EARLY TERMINATION CONTROLLER FOR ITERATIVE FEC DECODERS AND METHOD THEREFOR

(75) Inventor: Jason Duggan, Nepean (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 895 days.

(21) Appl. No.: 11/638,935

(22) Filed: Dec. 13, 2006

(65) Prior Publication Data

US 2008/0148133 A1 Jun. 19, 2008

(51) Int. Cl.
*H03M 13/03* (2006.01)
(52) U.S. Cl. .................. 714/755; 714/786; 714/758; 714/799
(58) Field of Classification Search .......... 714/755, 714/758, 799, 786
See application file for complete search history.

(56) References Cited

U.S. PATENT DOCUMENTS

| | | | | |
|---|---|---|---|---|
| 6,518,802 | B1 * | 2/2003 | Tu et al. ............. | 327/106 |
| 6,526,531 | B1 * | 2/2003 | Wang ................ | 714/704 |
| 6,686,853 | B2 * | 2/2004 | Shen et al. .......... | 341/50 |
| 6,865,708 | B2 * | 3/2005 | Wang ................ | 714/758 |
| 6,982,659 | B2 * | 1/2006 | Shen et al. .......... | 341/50 |
| 7,260,766 | B2 * | 8/2007 | Levy et al. .......... | 714/780 |
| 7,519,898 | B2 * | 4/2009 | Narayanan et al. .... | 714/801 |

* cited by examiner

*Primary Examiner*—Esaw T Abraham
(74) *Attorney, Agent, or Firm*—Christopher & Weisberg, P.A.

(57) ABSTRACT

A method, apparatus and system for improving block error rate performance of a receiver having an iterative decoder in a communication system, the method, apparatus and system includes receiving an encoded frame of data, the encoded frame of data includes a quantity of code blocks where each code block has a corresponding code block size, determining a first maximum number of iterations for each of the code blocks of the encoded frame of data iteratively performing a decoding operation on a first code block until the occurrence of one of (a) the first maximum number of iterations has been reached and (b) the first code block has converged, and determining a second maximum number of iterations for the remaining code blocks of the encoded frame of data based on the number of actual iterations used to decode the first code block.

20 Claims, 3 Drawing Sheets

EARLY TERMINATION CONTROLLER FOR ITERATIVE FEC DECODERS AND METHOD THEREFOR

CROSS-REFERENCE TO RELATED APPLICATION n/a

STATEMENT REGARDING FEDERALLY SPONSORED RESEARCH OR DEVELOPMENT n/a

FIELD OF THE INVENTION

The present invention relates to communication networks, and more particularly to a method, system and apparatus that provides for control of decoders in communication networks that employ forward error correction.

BACKGROUND OF THE INVENTION

The ever increasing demand for information exchange is a common characteristic of most areas of modern civilization. The transfer of information from the source to its destination has to be done in such a way that the quality and accuracy of the received information should be as close as possible to the quality and accuracy of the transmitted information. The information to be transmitted can be machine generated (e.g., images, computer data) or human generated (e.g., speech). Regardless of its source, the information must be translated into a set of signals optimized for the channel over which it is to be sent.

Transmission of digital data is inherently prone to noise and interference. This noise and interference may introduce errors into the transmitted data. Error detection schemes have been suggested to determine as reliably as possible whether errors have been introduced into the transmitted data. For example, it is common to transmit data in packets and add to each packet a cyclic redundancy check ("CRC") field, for example, that carries a checksum of the data of the packet. When a receiver receives the data, the receiver calculates the checksum on the received data and verifies whether the result of the calculation is identical to the checksum in the CRC field.

Various forward error correction ("FEC") coding techniques have been introduced to allow receivers of digital data to correctly determine the transmitted data even when errors may have occurred during transmission. For example, convolutional codes introduce redundancy into the transmitted data such that each bit is dependent on earlier bits in the sequence. Therefore, when errors occur, the receiver can still deduce the original data by tracing back possible sequences in the received data.

To further improve the performance of a communication system over a transmission channel, some coding schemes include interleavers, which rearrange the order of the coded bits in the packet. FEC decoders have difficulty recovering a series of errors in adjacent bits. The reordering by the interleaver spreads these affected bits throughout the code block allowing the FEC decoder a better chance to recover the bits in error. Other improvements may include multiple-component codes that encode the packet more than once; in parallel or in series. For example, it is known in the art to employ concatenated coding and error correction methods that use at least two convolutional coders serially or in parallel. Such parallel encoding is commonly referred to as turbo coding.

For multiple-component codes, optimal decoding is often a very complex task beyond the capabilities of current processors. Iterative decoding techniques have been developed to overcome this problem. Rather than determining immediately whether received bits are zero or one, the receiver assigns each bit a value on a multilevel scale representative of the probability that the bit is one. A common scale of such probabilities, referred to as log-likelihood ratio ("LLR"), which is a ratio of the probability that a bit is a zero to that of the probability that the bit is a one. Such values can represent each bit by a real number or, more commonly, an integer in some range, e.g., $\{-32, 31\}$. The sign of the LLR indicates the likelihood that the bit is a zero or a one, and the magnitude of the LLR represents the degree of likelihood. So, a value of 31 signifies that the transmitted bit was a zero with very high probability, and a value of $-32$ signifies that the transmitted bit was a one, with very high probability. A value of zero indicates that the logical bit value is indeterminate.

Data represented on the multilevel scale is referred to as "soft data", and iterative decoding is usually soft-in/soft-out, i.e., the decoding process receives a sequence of inputs corresponding to probabilities for the bit values and provides as output corrected probabilities, taking into account constraints of the code. Generally, a decoder that performs iterative decoding uses soft data from former iterations and improves this soft data in the decoding process. During iterative decoding of multiple-component codes, the decoder uses results from decoding of one code to improve the decoding of the second code. When serial encoders are used, two decoders may be used serially for this purpose. When parallel encoders are used, as in turbo coding, two corresponding decoders may conveniently be used in parallel for this purpose. Such iterative decoding is carried out for a plurality of iterations until it is believed that the soft data closely represents the transmitted data. After all of the iterations are complete the decoder makes "hard decisions" on each bit by examining the sign of the soft data. Those bits that have a positive sign (soft value between 0 and 31, for example) are assigned binary zero, and the remaining bits are assigned binary one.

Many communications systems use forward error correction techniques to improve the power efficiency of the system. In other words, FEC allows for the reliable detection of blocks of bits at a lower signal to noise ratio ("SNR") than would otherwise be possible. As previously mentioned, a prevalent FEC technique is the use of iterative decoders, with the most obvious example being Turbo decoders.

An iterative decoder functions, as its name suggests, to decode the data bits in a code block using multiple passes with the idea that the decoder eventually will converge to the "correct bits" for the packet being decoded.

At the start of the decoding of a code block, it is generally unknown how many iterations are necessary for convergence to occur (or if convergence will occur at all). This causes a problem because each additional iteration performed has an associated computational cost and yet the receiver will have a fixed amount of processing capability. A basic approach to resolving this problem is to set or fix the number of iterations to be a particular value in order that the processing load, in its worst case, can fit within the processing capacity of the decoder. One drawback to this simple approach is that some code blocks will still contain errors that could have been avoided by executing additional iterations. The block error rate ("BLER") performance of the decoder is a function of the number of iterations, and as such, more iterations yield a better BLER. Another drawback to this first approach is that for some code blocks the decoder will have converged to the "correct bits" in fewer than the set or fixed number of iterations, which means the decoder may have incurred unnecessary computational costs, with the associated implications of power consumption, and increased heat.

An improvement upon the above approach is to use an early termination detector within the iterative decoder. An early termination detector typically functions to make a determination at the end of each iteration performed, whether the decoder has converged to the "correct bits" for the code block. By doing so, the early termination detector can stop the decoder, and thereby prevent unnecessary iterations with the corresponding unnecessary computations.

Although early termination is an improvement for iterative decoders, there are still problems with this approach. As mentioned earlier, the receiver has a fixed amount of processing capacity and the "processing load" cannot exceed that processing capacity even during worst-case conditions. Therefore, a decoder with early termination calls for the maximum number of iterations to be specified. This "maximum number" must be set or fixed such that all code blocks in a frame can run to the maximum number of iterations (i.e. the worst-case scenario) thereby ensuring that the processing load does not exceed the decoder processing capacity. The quantity of code blocks in a frame with their corresponding code block sizes may vary and so the worst-case must take into account the maximum number of code blocks (or total bits). For example, the maximum number may be set to six iterations and the processing capacity sized to accommodate the maximum number of code blocks with this number of iterations. Early termination may stop the decoder at fewer than six iterations; however, the BLER performance will be no better than that of a fixed six-iteration BLER performance without early termination. Although early termination may reduce the total number of computations and thus yield "slack capacity", because the decoder functionality is typically specialized hardware, the "slack capacity" remains unused and unexploited.

It is therefore desirable to have method and system that provides for controlling the maximum number of iterations of iterative decoders in such a way as to exploit the full processing capacity of the decoder and optimize BLER performance.

SUMMARY OF THE INVENTION

The present invention advantageously provides a method and system for optimizing block error rate performance of a decoder by dynamically controlling the maximum number of iterations performed by the decoder to maximize decoder processing capacity.

A method for improving block error rate performance of a receiver having an iterative decoder in a communication system, the method includes receiving an encoded frame of data, the encoded frame of data including a quantity of code blocks where each code block has a corresponding code block size, determining a first maximum number of iterations for each of the code blocks of the encoded frame of data; iteratively performing a decoding operation on a first code block until the occurrence of one of (a) the first maximum number of iterations has been reached and (b) the first code block has converged, and determining a second maximum number of iterations for the remaining code blocks of the encoded frame of data based on the number of actual iterations used to decode the first code block.

An apparatus for improving block error rate performance of a receiver having an iterative decoder in a communication system, the apparatus includes an early termination controller, the early termination controller configurable to control early termination of the iterative decoder by determining a first maximum number of iterations for each of the code blocks of the encoded frame of data, the encoded frame of data including a quantity of code blocks where each code block has a corresponding code block size, iteratively performing a decoding operation on a first code block until the occurrence of one of (a) the first maximum number of iterations has been reached and (b) the first code block has converged, and determining a second maximum number of iterations for the remaining code blocks of the encoded frame of data based on the number of actual iterations used to decode the first code block.

A receiver having improved block error rate performance, the receiver includes a memory for storing data corresponding to a maximum number of iterations for each code block of an encoded frame of data, and a processor, the processor operating to receive an encoded frame of data, determine a first maximum number of iterations for each of the code blocks of the encoded frame of data, where the encoded frame of data includes a quantity of code blocks where each code block has a corresponding code block size, iteratively perform a decoding operation on a first code block until the occurrence of one of (a) the first maximum number of iterations has been reached and (b) the first code block has converged, and determine a second maximum number of iterations for the remaining code blocks of the encoded frame of data based on the number of actual iterations used to decode the first code block.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

It is to be understood that both the preceding summary and the following detailed description are exemplary and explanatory and are intended to provide further explanation of the invention as claimed. Neither the summary nor the description that follows is intended to define or limit the scope of the invention to the particular features mentioned in the summary or in the description. The present invention provides a method, system and apparatus for improving the block error rate of a receiver by dynamically controlling the maximum number of iterations of an iterative forward error correction decoder that implements early termination.

As an initial matter, reference may be made herein to "convergence" and "converged". As used herein, convergence is a state that indicates a high level of confidence that the decoded bits represent the bits that were transmitted. The state of convergence, i.e., converged or not converged, is determined by one or more criteria. Measurements are made based on the soft outputs of each iteration and evaluated against the one or more criteria to determine whether the state is converged or not converged.

Figure 1:
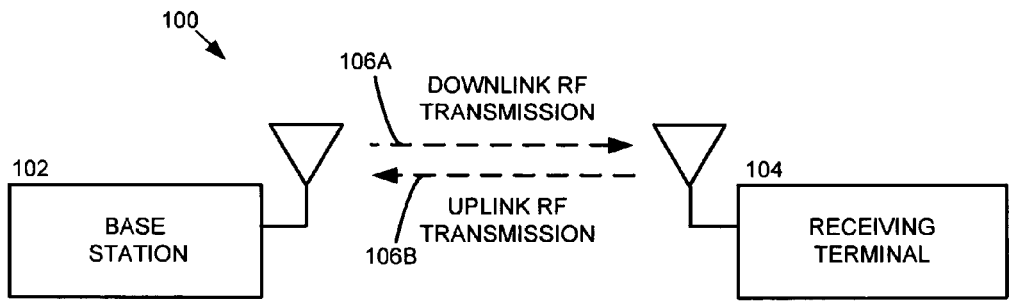
FIG. 1 is a block diagram of a communication network constructed in accordance with the principles of the present invention.

Referring now to the drawing figures in which like reference designators refer to like elements, there is shown in FIG. 1, a block diagram of an exemplary communication system 100 capable of implementing embodiments of the present invention. The communication system 100 may carry voice and/or data. In this embodiment, communication system 100 includes a base (or transmitting) station ("BS") 102 that transmits signals to a receiving terminal ("RT") 104 over a RF downlink 106A (also called a forward link). Because the signals transmitted from the base station 102 contain user data, the RF downlink 106A will have at least a traffic channel. The base station 102 receives signals from the receiving terminal 104 over a RF uplink 106B (also called a reverse link). If a two-way user data communication is desired, both the RF downlink 106A and the RF uplink 106B will comprise traffic channels. For simplicity, the communication system 100 is shown to include only two stations. Such a system can represent, e.g., two computers communicating with each other. However, other variations and configurations of the communication system 100 are possible.

In a multi-user, multiple-access communication system, a single transmitting station 102 may be used to concurrently or sequentially transmit data to and receive data from a number of receiving terminals. There are several multi-user, multiple-access communication systems, utilizing techniques such as: time division multiple-access ("TDMA"), frequency division multiple-access ("FDMA"), amplitude modulation ("AM") schemes, and other techniques known in the art. Another type of multi-user, multiple-access communication system technique is a code division multiple-access ("CDMA") spread spectrum system that conforms to the "TIA/EIA/IS-95 Mobile Station-Base Station Compatibility Standard for Dual-Mode Wide-Band Spread Spectrum Cellular System," hereinafter referred to as the IS-95 standard.

Additional examples include communication systems conforming to the "3rd Generation Partnership Project" ("3GPP") and embodied in a set of documents including Document Nos. 3G TS 25.211, 3G TS 25.212, 3G TS 25.213, and 3G TS 25.214 (the W-CDMA standard), or "TR-45.5 Physical Layer Standard for cdma2000 Spread Spectrum Systems" (the IS-2000 standard). Another example is an Orthogonal Frequency Division Multiple Access ("OFDMA") system such as that defined in the IEEE 802.16 standards.

The RF downlink 106A and RF uplink 106B can propagate through a guiding media, e.g., a wire, a coaxial cable, an optical cable or other media known to one skilled in the art, or in case of wireless links through free space.

The types of receiving terminal 104 could be any of a number of different types of wireless communication device such as a portable phone, a cellular telephone that is connected to a laptop computer running IP-based, Web-browser applications, a cellular telephone with associated hands-free car kits, a personal data assistant ("PDA") running IP-based, Web-browser applications, a wireless communication module incorporated into a portable computer, or a fixed location communication module such as might be found in a wireless local loop or meter reading system. In the most general embodiment, mobile stations may be any type of communication unit. This could also be part of a stand-alone device such as a wireless router device purchased for 802.11 home networks.

Figure 2:
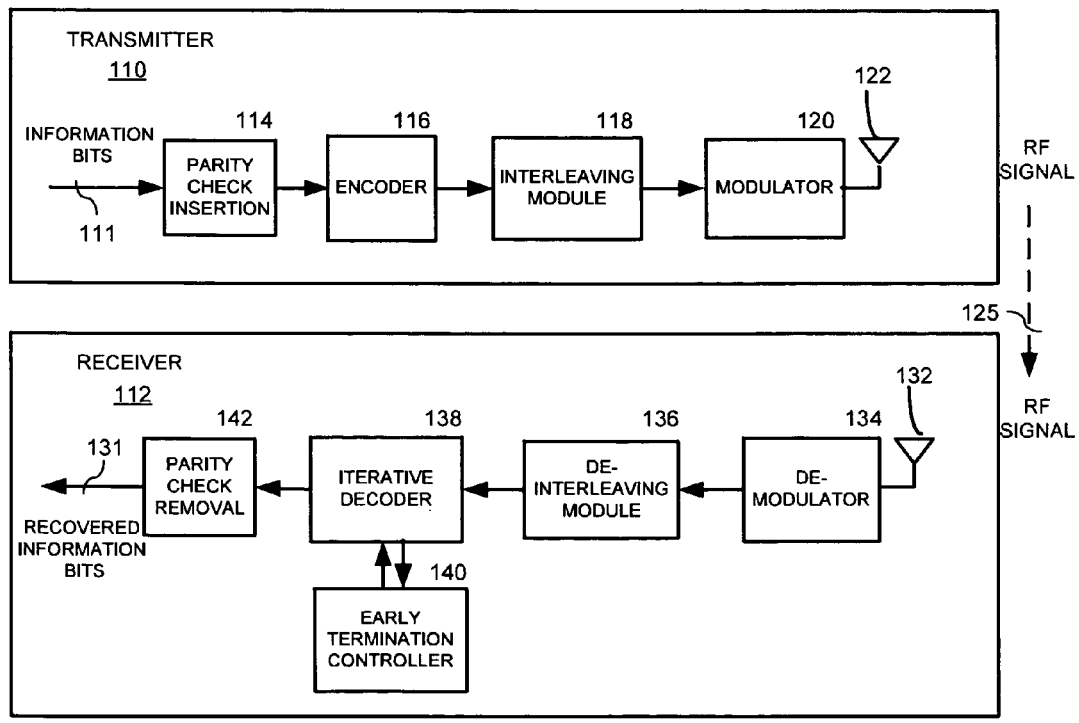
FIG. 2 is a more detailed block diagram of a transmitter and receiver of FIG. 1 constructed in accordance with the principles of the present invention.

FIG. 2 is a detailed block diagram of an exemplary transmitter 110 and receiver 112 configured in accordance with one embodiment of present invention. The transmitter 110 and receiver 112 can be used within a base station 102 or receiving terminal 104, as well as any other system that generates and receives digital signals for transmission. The transmitter and receiver processing shown represents just one possible embodiment of the invention, as numerous other transmitter and receiver processing schemes may incorporate and benefit from the use of various embodiments of the invention.

Referring to FIG. 2, a transmitter 110 includes parity check insertion module 114, encoder circuit 116, interleaving module 118, modulator circuit 120 and antenna 122. Information bits 111 are input to parity check insertion module 114. Parity check insertion module 114 processes the information bits 111, e.g., a frame of "N" data bits to calculate "C" parity bits for the information bits 111. Parity check insertion module 114 also inserts the C parity check bits into the encoded data as error detection information, which it supplies as input to the encoder 116. Encoder 116 encodes the frame of length, or size, N+C bits in accordance with an encoding process, for example with two convolutional block codes to generate an encoded frame of N+C data bits, also referred to as code blocks. The encoded frame of N+C data bits from encoder 116 is supplied to interleaving module 118. Interleaving module 118 rearranges the encoded frame such that consecutive data are split among different blocks as they are received and outputs interleaved bits or blocks to modulator 120. As would be apparent to one skilled in the art, multiple types of forward error correction codes that employ iterative decoders may be employed including Turbo codes and Low Density Parity Check (LDPC) codes.

The encoded frames are then applied to modulator 120, which generates a modulated waveform based on the encoded frames received. Typical modulation techniques include quadrature phase-shift keying ("QPSK"), 8 phase-shift keying ("8-PSK"), and 16 quadrature amplitude modulation ("QAM"), although various other modulation schemes may be utilized. The modulated waveform is then up-converted for transmission at an RF frequency via antenna 122, which provides transmission of the RF signal through communication channel 125. Added noise and channel memory distort the signal as it passes through communication channel 125, inserting errors into the encoded frame.

The order of encoding and inserting parity check bits by encoder circuit 116 and parity check insertion module 114 is exemplary only and one skilled in the art would readily recognize that other encoding and error detection code structures may be used.

Continuing to refer to FIG. 2, receiver 112 includes antenna 132, which is configurable to provide the received RF signal from the communication channel 125 to demodulator circuit 134. Demodulator circuit 134 performs down-conversion, filtering and digitalization of the received RF signal to provide the encoded frame of (N+C) bits to de-interleaving module 136 where the interleaved data is arranged back into the original sequence by de-interleaving module 136. Iterative decoder 138 decodes the encoded frame and its corresponding soft decision data with an iterative decoding algorithm including early termination detection and early termination controller 140 in accordance with an exemplary implementation of the present invention.

While ensuring not to exceed the total number cycles available for a particular decoder, the early termination controller 140 determines the maximum number of iterations that can be used for all code blocks in the encoded frame. In other words, decoder 138 of receiver 112 has a fixed amount of processing capacity and the processing load cannot exceed that processing capacity, therefore early termination controller 140 will specify the maximum number of iterations such that all code blocks in the encoded frame can run the maximum number of iterations. As used herein, the term "iteration" is defined to include "half-iterations" as used by decoders that decode two parallel constituent coders such as a turbo decoder. For such decoders, the decoding of one of the constituent codes is called a "half-iteration" and a "full iteration" is when both constituent codes have been decoded.

In one embodiment, early termination controller 140 has knowledge of the number of cycles available, or the time allotted (e.g., the capacity of the decoder) to decode the complete frame (i.e., all code blocks) and dynamically adjusts the maximum number of iterations such that this capacity, or allotted time, is never exceeded. In addition, as the iterative decoder 138 operates over the code blocks in the frame and feeds back the number of cycles (e.g., number of iterations or time) actually used, the early termination controller 140 re-calculates the number of cycles (or amount of time) available for the remainder of the frame.

Early termination controller 140 also can have a priori knowledge of the decoder in terms of the number of cycles (or percentage of capacity or time) required to decode a code block as a function of the number of iterations and size of the code block. This may be a lookup table, which can contain performance information about the iterative decoder 116, such as the number of cycles that are required for decoding a code block of a specific size at a given number of iterations, or it may be an equation that expresses the relationship. Early termination controller 140 further can have knowledge of the number of code blocks and the sizes of all of those code blocks, prior to beginning the decoding for a frame. In another embodiment, early termination controller 140 can use its knowledge of the number of cycles available for the remainder of the frame, the number of code blocks remaining with the corresponding code block sizes, in conjunction with its a priori knowledge of the number of cycles required to decode the different sized code blocks as a function of the number of iterations to determine the maximum number of iterations to perform for the next code block. Early termination controller 140 can accomplish this by assuming that all remaining code blocks require the same number of iterations and then determine the maximum number of iterations that could be performed for all code blocks while staying within the remaining number of cycles available.

Figure 3:
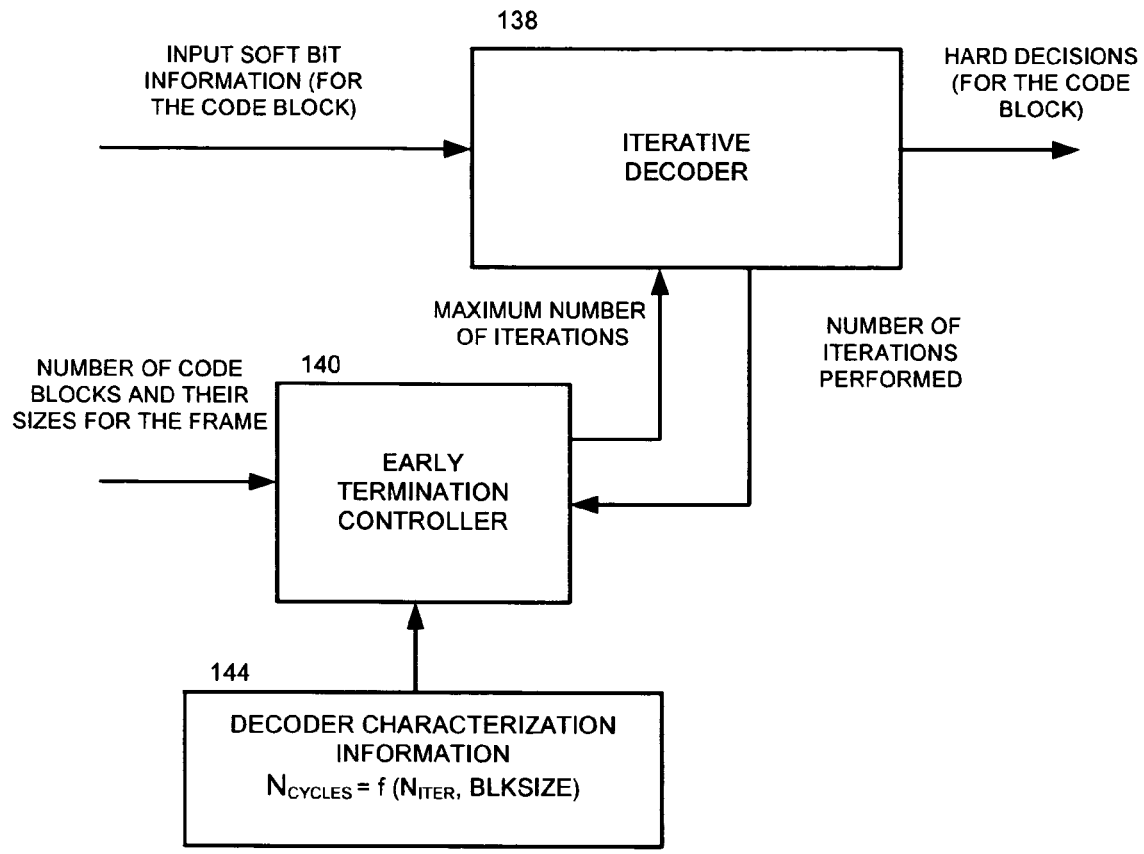
FIG. 3 is a block diagram of an early termination controller module constructed in accordance with the principles of the present invention.

FIG. 3 illustrates this relationship between early termination controller 140 and iterative decoder 138. The total number of cycles required to process a code block by the iterative decoder 138 (e.g., $N_{CYCLES}$) is a function of the number of iterations (e.g., $N_{ITER}$) and the block size (e.g., BlkSize):

$$N_{CYCLES} = f(N_{ITER}, \text{BlkSize})$$

Still referring to FIG. 3, early termination controller 140 receives an encoded frame of data, which includes a quantity of code blocks (e.g., "$CB_1$ through to $CB_X$") with corresponding code block sizes (e.g., "$CS_1$ through to $CS_X$") from a communication channel and determines the maximum number of iterations that could be used for all code blocks $CB_1$ through to $CB_X$ in the frame without exceeding the capacity, e.g., total number of cycles of iterative decoder 138. Iterative decoder 138 processes input soft bit information for each of the code blocks $CB_1$ through to $CB_X$, issues a hard decision for each of the code blocks and provides information of the number of actual iterations performed to the early termination controller 140. The exact equations that describe how the maximum number of iterations for the next code block should be calculated will depend on the functional relationship between the number of cycles and the number of iterations. In the most general case of using a look-up table, a brute force calculation summing up the number of cycles of each remaining code block to calculate the required number of cycles for each possible number of iterations, and a simple comparison to the number of cycles available will yield the solution. A person skilled in the art will realize that there may be several ways to compute precisely or to estimate the maximum number of iterations.

Returning to FIG. 2, upon completion of decoding, the iterative decoder 138 outputs the decoded data frame, which includes the error detection information to parity check removal circuit 142. Parity check removal circuit 142 retrieves the error detection information, e.g., the parity check bits from the decoded data frame, calculates a parity check value and determines whether the calculated parity check value is equivalent to the parity check value included in the error detection information. When the calculated parity check value is equivalent to the parity check value included in the error detection information, there is a high level of confidence that the block or frame of encoded data was decoded properly.

Figure 4:
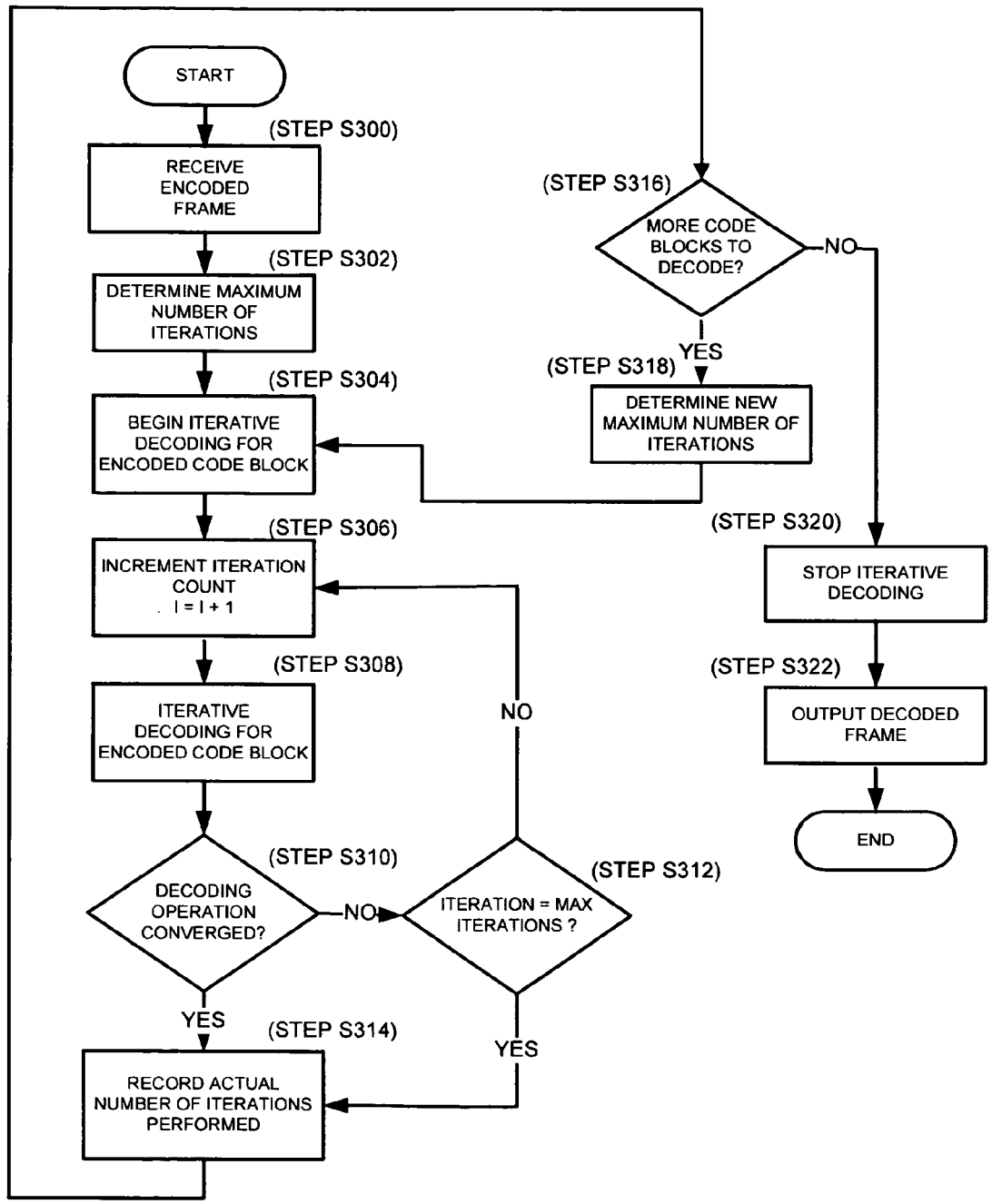
FIG. 4 is a detailed flowchart of an early termination controller process in accordance with the principles of the present invention.

An exemplary mode of operation of an embodiment of the early termination controller 140 of receiver 112 is discussed with respect to the flowchart of FIG. 4. In step S300, a receiver 112 having an early termination controller 140 receives an encoded frame of data from a communication channel. The frame of data includes a quantity of code blocks with corresponding code block sizes. In step S302, early termination controller 140 determines the maximum number of iterations that could be used for all code blocks in the frame without exceeding the capacity, e.g., total number of cycles available for iterative decoder 138. At step S304, the iterative decoding of the first code block commences and an iteration counter is incremented (step S306). Another iteration of decoding is performed on the first code block at step S308. A determination of whether the first code block has converged to the "correct block" of data, as ascertained by the early termination detector, at step S310. If the decoding operation of the encoded code block converged, then iterative decoder 138 reports the actual number of iterations performed to early termination controller 140. Otherwise, the number of performed iterations is compared to the value of the maximum number of iterations to determine whether the maximum number of iterations for that code block was reached (step S312). If the maximum number of iterations for that code block was not reached, the iteration counter is incremented and another decoding iteration is performed on the code block (step S306). On the other hand, if the maximum number of iterations for that code block was reached, the decoding process of that code block is halted and the number of performed iterations is reported by iterative decoder 138 to early termination controller 140 (step S314).

At step S316, a determination of whether additional code blocks of the encoded data frame have yet to be decoded. If additional code blocks are waiting, early termination controller 140 uses the number of iterations actually performed to determine a corresponding number of cycles used and decrements the total number of cycles available in the frame by the number of cycles used to decode the first code block. Early termination controller 140 then re-assesses the value of the maximum number of iterations that could be used for the remaining code blocks in the encoded frame. This new maximum value of iterations becomes the specified maximum number of iterations used for the next or second code block of the encoded data frame (step S318). This process repeats itself throughout all of the code blocks in the frame. Frequently, iterative decoder 138 will be able to decode the code block with fewer iterations than the maximum specified. If so, then this process will, in turn, allow for a new, larger maximum number of iterations for the ensuing code blocks. Some of these code blocks may advantageously utilize the extra iterations to converge and thereby lower the BLER of the receiver 112.

For example, based on the processing capacity of the iterative decoder 138 chosen, or based on a chosen block error rate desired, assume that the maximum number of iterations is calculated or chosen to be five. Now assume that starting with the first code block of an encoded data frame, four iterations are necessary for convergence. Accordingly, the one iteration that was not used during the decoding of the first code block can be "banked", which provides a new maximum number of iterations value of six (e.g., the five iterations from the initially determined maximum number of iterations plus the one banked iteration not used for the first code block decoding process). Assuming that the second code block of the encoded data frame also only requires four iterations for convergence, there are now two iterations to bank, for example, the maximum of six iterations minus the four used iterations equals to two extra iterations for use on one of the remaining code blocks of the encoded frame. These two banked iterations can be used in conjunction with the original allocated five iterations, if it is assumed that a third code block of the encoded data frame requires seven iterations for convergence. The capability to reach convergence of the third code block is realized because of the banking of capacity during the decoding of the first and second code blocks. If the excess capacity of the first two decoding sessions was not available to the third decoding session, then the third code block would not reach convergence and thus the block error rate would be greater.

In the above-mentioned examples, the code blocks positioned later in the encoded frame will tend to have more iterations available as the benefits of the early termination accumulate. Alternatively, early termination controller 140 could assume that the early termination will be effective in reducing the number of iterations and permit the first set of code blocks to have a larger maximum number of iterations. In general, the early termination will "catch-up" and ensure that all of the code blocks have this larger number of maximum iterations within which to successfully converge. The determination of the appropriate value for the maximum number of iterations for the first set of code blocks could be determined empirically through simulations across a variety of channel conditions.

In another embodiment of the present invention, various measures could be applied to the code blocks at the start of the frame, prior to sending them into the decoder, to estimate the number of iterations that will be required. The controller could beneficially use such information to schedule those code blocks that will require fewer iterations first. The type of measures that could be applied could include estimating the average signal to noise ratio, and/or the variance of the signal to noise ratio across the code block.

Often a CRC check is applied after the decoding of the encoded code block to verify the bits in the block. If a code block was in error based on its CRC check, it could be rescheduled by the controller and tried with a larger value for the maximum number of iterations. The controller could either wait until all the other code blocks had been processed and determine how many cycles are left over, or it could lower the maximum number of iterations for other code blocks to fit in the retry of the erroneous block.

In another embodiment, all code blocks are not equally important. For example, if successful detection of some code blocks, e.g., control information or time sensitive data is more important than other code blocks, then early termination controller 140 can take such information into account by allowing a larger maximum number of iterations for those important code blocks.

Many of the functional units described in this specification have been labeled as modules, in order to more particularly emphasize their implementation independence. For example, a module may be implemented as a hardware circuit comprising custom circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

A module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The present invention advantageously provides a method and system to improve block error rate performance of a receiver by dynamically controlling the maximum number of iterations performed by an iterative forward error correction decoder that implements early termination.

The present invention can be realized in hardware, software, or a combination of hardware and software. An implementation of the method and system of the present invention can be realized in a centralized fashion in one computing system or in a distributed fashion where different elements are spread across several interconnected computing systems. Any kind of computing system, or other apparatus adapted for carrying out the methods described herein, is suited to perform the functions described herein.

A typical combination of hardware and software could be a specialized or general-purpose computer system having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. In addition, unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

It will be appreciated by persons skilled in the art that the present invention is not limited to what has been particularly shown and described herein above. A variety of modifications and variations are possible in light of the above teachings without departing from the spirit or essential attributes thereof, and accordingly, reference should be had to the following claims, rather than to the foregoing specification, as indicating the scope of the of the invention.

What is claimed is:

1. A method for improving block error rate performance of a receiver having an iterative decoder in a communication system, the method comprising:
    receiving an encoded frame of data, the encoded frame of data including a quantity of code blocks where each code block has a corresponding code block size;
    determining a first maximum number of iterations for each of the code blocks of the encoded frame of data;
    iteratively performing a decoding operation on a first code block until the occurrence of one of (a) the first maximum number of iterations has been reached and (b) the first code block has converged; and
    determining a second maximum number of iterations for the remaining code blocks of the encoded frame of data based on the number of actual iterations used to decode the first code block.

2. The method of claim 1, further comprising recording the number of actual iterations performed during decoding of the first code block to determine the number of cycles used during the decoding of the first code block.

3. The method of claim 1, further comprising performing a decoding operation on a second code block until the occurrence of one of (a) the second maximum number of iterations has been reached and (b) the second code block has converged.

4. The method of claim 1, wherein determining a first maximum number of iterations includes using a lookup table.

5. The method of claim 1, wherein determining a first maximum number of iterations includes using knowledge of the number of cycles required to decode a code block as a function of the number of iterations and size of the code block for the iterative decoder.

6. The method of claim 1, wherein determining a first maximum number of iterations includes increasing the maximum number of iterations for a first set of code blocks in the encoded frame.

7. The method of claim 1, wherein determining a first maximum number of iterations includes increasing the maximum number of iterations for a class of predetermined high priority code blocks in the encoded frame.

8. The method of claim 1, further comprising:
    applying a parity check to a decoded code block to verify the bits in the decoded code block; and
    if it is determined that the decoded code block is in error, scheduling the erroneously decoded code block for another decoding process.

9. The method of claim 8, wherein scheduling the erroneously decoded code block for another decoding process includes
    recording the number of actual iterations used during the first decoding attempt of the erroneously decoded code block; and
    determining a new maximum number of iterations for the erroneously decoded code block based on the number of actual iterations used during the first decoding attempt of the erroneously decoded code block.

10. The method of claim 1, wherein determining a first maximum number of iterations includes using one or more signal measurements to determine estimates of the number of iterations required to decode a code block in a frame and adjusting the first maximum number of iterations assigned to at least one code block.

11. An apparatus for improving block error rate performance of a receiver having an iterative decoder in a communication system, the apparatus comprising:
    an early termination controller, the early termination controller controlling early termination of the iterative decoder by determining a first maximum number of iterations for each of the code blocks of the encoded frame of data, the encoded frame of data includes a quantity of code blocks where each code block has a corresponding code block size;
        iteratively performing a decoding operation on a first code block until the occurrence of one of (a) the first maximum number of iterations has been reached and (b) the first code block has converged; and
        determining a second maximum number of iterations for the remaining code blocks of the encoded frame of data based on the number of actual iterations used to decode the first code block.

12. The apparatus of claim 11, wherein the early termination controller uses the iterative decoder to record the number of actual iterations performed during decoding of the first code block to determine the number of cycles used during the decoding of the first code block.

13. The apparatus of claim 11, wherein the early termination controller uses the iterative decoder to perform a decoding operation on a second code block until the occurrence of one of (a) the second maximum number of iterations has been reached and (b) the second code block has converged.

14. The apparatus of claim 11, wherein the early termination controller determines a maximum number of iterations by using a lookup table.

15. The apparatus of claim 11, wherein the early termination controller has knowledge of the number of cycles required to decode a code block as a function of the number of iterations and size of the code block for the iterative decoder.

16. The apparatus of claim 11, wherein the early termination controller determines a maximum number of iterations by increasing the maximum number of iterations for a first set of code blocks in the encoded frame.

17. The apparatus of claim 11, wherein the early termination controller determines a maximum number of iterations by increasing the maximum number of iterations for a class of predetermined high priority code blocks in the encoded frame.

18. The apparatus of claim 11, wherein the early termination controller applies a parity check to a decoded code block to verify the bits in the decoded code block; and
    if it is determined that the decoded code block is in error, reschedules the erroneous decoded code block for another decoding process.

19. A receiver having improved block error rate performance, the receiver comprising:
 a memory for storing data corresponding to a maximum number of iterations for each code block of an encoded frame of data; and
 a processor, the processor operating to:
  receive an encoded frame of data;
  determine a first maximum number of iterations for each of the code blocks of the encoded frame of data, where the encoded frame of data includes a quantity of code blocks where each code block has a corresponding code block size;
  iteratively perform a decoding operation on a first code block until the occurrence of one of (a) the first maximum number of iterations has been reached and (b) the first code block has converged; and
  determine a second maximum number of iterations for the remaining code blocks of the encoded frame of data based on the number of actual iterations used to decode the first code block.

20. The receiver of claim 19, wherein the processor operates to perform a decoding operation on a second code block until the occurrence of one of (a) the second maximum number of iterations has been reached and (b) the second code block has converged.

* * * * *